(12) United States Patent
Kimura et al.

(10) Patent No.: US 9,999,164 B2
(45) Date of Patent: Jun. 12, 2018

(54) COOLING APPARATUS FOR COOLING ELECTRONIC DEVICE IN AIRCRAFT

(71) Applicant: IHI Corporation, Kotu-ku (JP)

(72) Inventors: Hiroyuki Kimura, Tokyo (JP); Shinsuke Matsuno, Tokyo (JP); Noriko Morioka, Tokyo (JP); Naoki Seki, Tokyo (JP)

(73) Assignee: IHI Corporation, Koto-ku (JP)

( * ) Notice: Subject to any disclaimer, the term of this patent is extended or adjusted under 35 U.S.C. 154(b) by 0 days. days.

(21) Appl. No.: 15/288,468

(22) Filed: Oct. 7, 2016

(65) Prior Publication Data

US 2017/0027088 A1    Jan. 26, 2017

Related U.S. Application Data

(63) Continuation of application No. PCT/JP2015/072374, filed on Aug. 6, 2015.

(30) Foreign Application Priority Data

Aug. 13, 2014   (JP) .................. 2014-164792

(51) Int. Cl.
| | |
|---|---|
| *H05K 7/20* | (2006.01) |
| *B64D 13/08* | (2006.01) |
| *B64D 47/00* | (2006.01) |
| *B64D 13/06* | (2006.01) |

(52) U.S. Cl.
CPC ......... *H05K 7/20863* (2013.01); *B64D 13/08* (2013.01); *B64D 47/00* (2013.01); *H05K 7/20881* (2013.01); *B64D 2013/0614* (2013.01)

(58) Field of Classification Search
CPC ......... Y02T 50/56; Y02T 50/44; B64D 13/06; B64D 13/08; B64D 2013/0614; B64D 2013/0618; B64D 47/00; H05K 7/20863; H05K 7/20881
See application file for complete search history.

(56) References Cited

U.S. PATENT DOCUMENTS

| | | | |
|---|---|---|---|
| 3,752,422 A * | 8/1973 | Runnels ................. | B64D 13/00 244/118.5 |
| 4,819,720 A | 4/1989 | Howard | |
| 5,481,433 A * | 1/1996 | Carter ....................... | B60L 3/00 165/185 |

(Continued)

FOREIGN PATENT DOCUMENTS

| | | |
|---|---|---|
| FR | 2 995 589 A1 | 3/2014 |
| GB | 2 389 174 A | 12/2003 |

(Continued)

OTHER PUBLICATIONS

Written Opinion dated Sep. 29, 2015 in PCT/JP2015/072374, filed on Aug. 6, 2015.

*Primary Examiner* — Adam B Dravininkas
(74) *Attorney, Agent, or Firm* — Oblon, McClelland, Maier & Neustadt, L.L.P.

(57) ABSTRACT

A cooling device applicable to an airplane having a pressurized cabin and a ram air channel for cooling an electronic device arranged in the pressurized cabin, is comprised of a partition wall separating the pressurized cabin from the ram air channel; and a heat exchanger thermally in contact with the electronic device and exposed to the ram air channel so as to radiate heat to a ram air.

5 Claims, 3 Drawing Sheets

(56) References Cited

U.S. PATENT DOCUMENTS

| | | | |
|---|---|---|---|
| 8,408,281 B2 * | 4/2013 | Hamstra | B64D 13/00 165/109.1 |
| 9,653,375 B2 * | 5/2017 | Kawaguchi | H05K 7/20918 |
| 2005/0030647 A1 | 2/2005 | Amanai | |
| 2008/0309175 A1 * | 12/2008 | Telakowski | H02K 9/04 310/59 |
| 2010/0006261 A1 * | 1/2010 | Ishida | B61C 17/00 165/86 |
| 2011/0133026 A1 | 6/2011 | Behrens et al. | |
| 2011/0183595 A1 * | 7/2011 | Liebich | B64D 13/02 454/70 |
| 2012/0012294 A1 * | 1/2012 | Miki | B61C 17/00 165/185 |
| 2012/0014784 A1 | 1/2012 | Hipsky et al. | |
| 2012/0160445 A1 * | 6/2012 | Baumgardt | B64C 1/26 165/41 |
| 2013/0048242 A1 | 2/2013 | Ofoma et al. | |
| 2013/0333857 A1 | 12/2013 | Guering et al. | |
| 2014/0246170 A1 * | 9/2014 | Snyder | F02K 3/115 165/51 |
| 2014/0345305 A1 * | 11/2014 | Sieme | B64D 13/08 62/79 |

FOREIGN PATENT DOCUMENTS

| | | |
|---|---|---|
| JP | 61-181800 | 8/1986 |
| JP | 64-61999 | 3/1989 |
| JP | 1-256775 | 10/1989 |
| JP | 3-25096 A | 2/1991 |
| JP | 11-44463 | 2/1999 |
| JP | 2004-29554 | 1/2004 |
| JP | 2004-256051 | 9/2004 |
| JP | 2006-42441 | 2/2006 |
| JP | 2008-312439 | 12/2008 |
| JP | 2012-25382 | 2/2012 |
| WO | WO 2012/065713 A2 | 5/2012 |

\* cited by examiner

COOLING APPARATUS FOR COOLING ELECTRONIC DEVICE IN AIRCRAFT

CROSS-REFERENCE TO RELATED APPLICATIONS

This application is a Continuation Application of PCT International Application No. PCT/JP2015/072374 (filed Aug. 6, 2015), which is in turn based upon and claims the benefit of priority from Japanese Patent Application No. 2014-164792 (filed Aug. 13, 2014), the entire contents of which are incorporated herein by reference.

BACKGROUND

Technical Field

The disclosure herein relates to a cooling device for cooling electronic devices in an aircraft, and in particular to a cooling device that does not require an ambient air introduction system prepared particularly for cooling electronic devices.

Description of the Related Art

In airplanes so far, any power transmissions have employed mechanical links in general. When ailerons are to be moved for example, a pilot first moves a control column, a mechanical link next transmits its motion to a hydraulic system, and the hydraulic system then drives the ailerons. From an engine, a gear system extracts part of its driving force and transmits it to a fuel pump, thereby driving the fuel pump.

The latest technology enables these mechanical links to be successively replaced with electronic means, thereby reducing weights of airplanes. Weight reduction, of course, contributes improvement in energy efficiency to a great degree.

Further, electronic control is applied to so many devices and this also leads to improvement of performance of airplanes. Further many electric components such as a heater for de-icing are used.

These circumstances increase electric power demand in airplanes. To meet such power demand, power supply systems using power semiconductors such as insulated gate bipolar transistors (IGBTs) are used. These power supply systems convert alternate current power that is output by generators combined with engines into direct current power, supply it to respective devices, store surplus power in storage batteries, and convert part of the direct current power into stepped-up or stepped-down alternate current power and supply it to respective devices. As these systems can use AC-DC conversion by means of semiconductors with improved energy efficiency such as IGBTs, excellent power efficiency and controllability are now realized.

On the other hand, device cooling in airplanes is a growing technical problem. Japanese Patent Applications Laid-open No. S64-61999 and No. 2008-312439 disclose arts related to cooling systems for devices in airplanes.

SUMMARY

When the aforementioned power supply system is to be operated in a pressurized cabin in an airplane, a problem of cooling must arise. The reason is that the pressurized cabin is in a semi-closed circumstance and therefore there must not be any place for dumping heat. As the power supply system treats more power, this problem could grow worse.

If the power supply system is operated outside the pressurized cabin, the problem of cooling could be relieved but another problem could arise. More specifically, while direct current gives rise to electric discharge and, once discharge starts, the discharge is unlikely to stop by itself, the low-pressure atmosphere at high altitude is more likely to cause discharge. One of solutions for this problem is to decrease the voltage of the direct current but this leads to severe impairment in efficiency of the power supply system.

The cooling device disclosed in the present application is intended to solve these problems.

A cooling device applicable to an airplane having a pressurized cabin and a ram air channel for cooling an electronic device arranged in the pressurized cabin, is comprised of a partition wall separating the pressurized cabin from the ram air channel; and a heat exchanger thermally in contact with the electronic device and exposed to the ram air channel so as to radiate heat to a ram air.

DETAILED DESCRIPTION OF THE EXEMPLARY EMBODIMENTS

Exemplary embodiments will be described hereinafter with reference to the appended drawings. It is particularly noted that these drawings are not always drawn to scale exactly and therefore dimensional relations among elements are not limited to those shown therein.

In the embodiments described below, a cooling system is used for cooling power semiconductors in a power supply system but may be instead used for cooling other devices such as a controller circuit for example.

Figure 1:
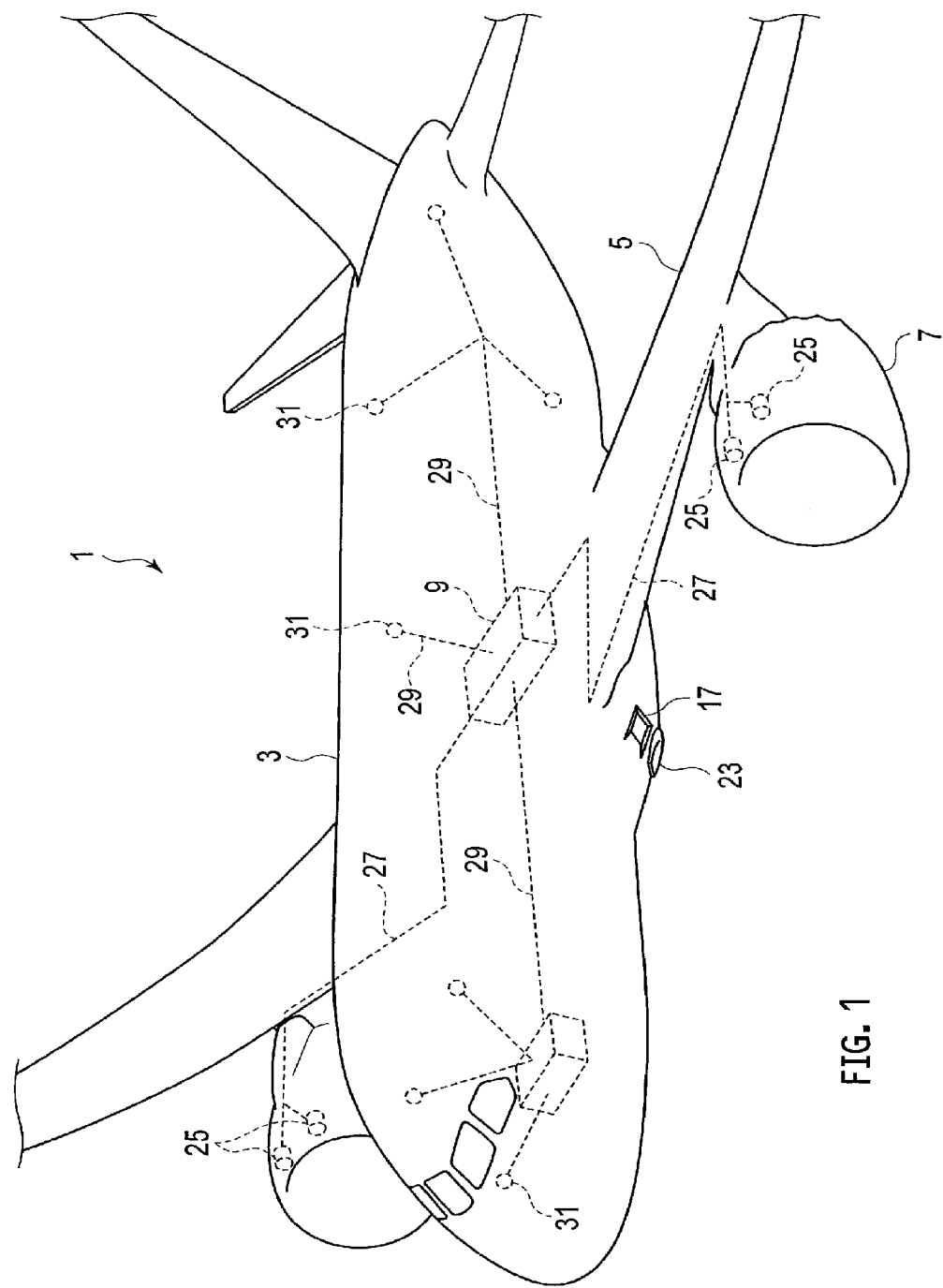
FIG. 1 is a schematic perspective view of an airplane having a pressurized cabin and a ram air channel.

Referring to FIG. 1, an airplane 1 is comprised of a body 3 and main wings 5. A considerable part in the interior of the body 3 is a pressurized cabin where the air is pressurized relative to the atmosphere.

The airplane 1 is further comprised of engines 7 respectively suspended from the main wings 5. Each engine 7 creates thrust force and is as well comprised of a generator to generate alternate current power. The alternate current power is led through a feeding line 27 to an electric chamber 9 in the pressurized cabin.

The power supply system is comprised of converters for converting the alternate current power into direct current power, and is further comprised of inverters for further converting part thereof into alternate current power. These converters and inverters are arranged in the pressurized electric chamber 9. The converted direct current power and the re-converted alternate current power are fed through onboard lines 29 to respective devices 31.

Figure 2:
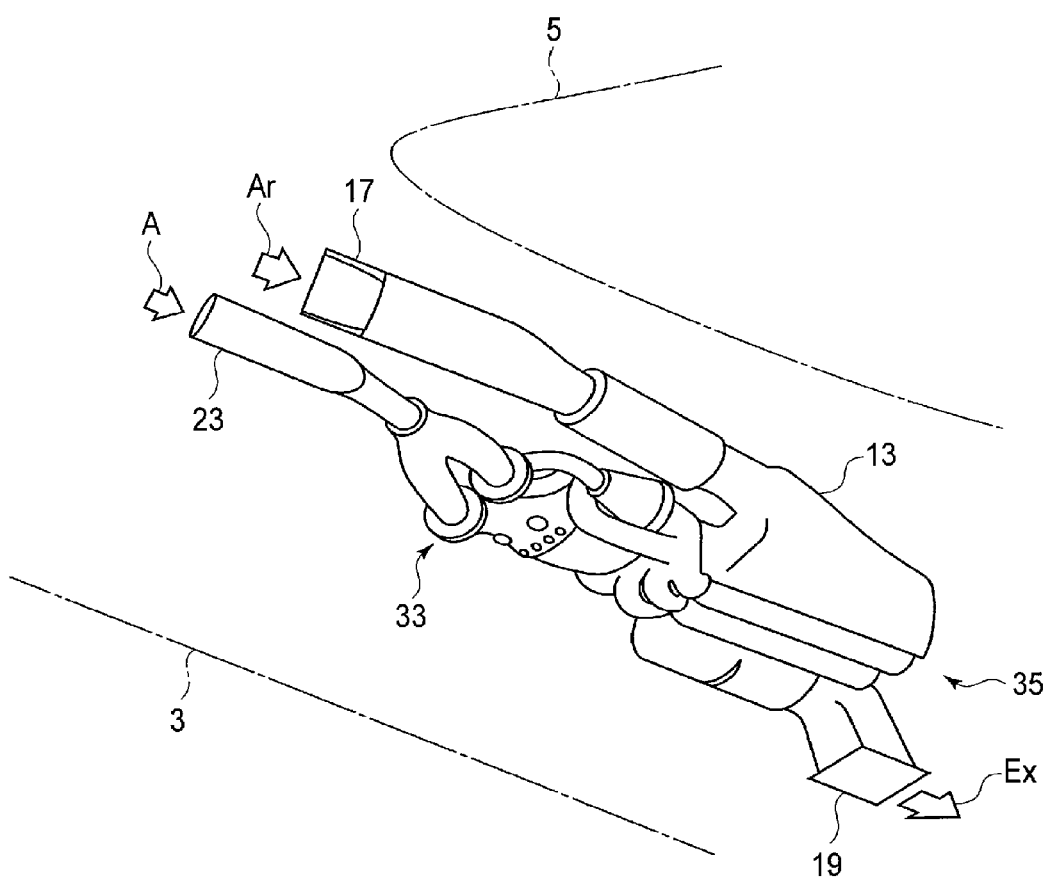
FIG. 2 is a schematic perspective view of an air introduction system for the pressurized cabin and the ram air channel.

Referring to FIG. 2 in combination with FIG. 1, the airplane 1 is comprised of a pressurizing system in order to supply pressurized air to the pressurized cabin. The pressurizing system is generally constituted of an inlet 23 opened at the bottom of the body 3 and a compressor 33 in communication therewith. The compressor 33 pressurizes the ambient air A sucked through the inlet 23 up to a pressure close to the atmospheric pressure on the ground and supplies it to the pressurized cabin.

The ambient air at high altitudes can drop in temperature down to a considerably low temperature (−50 degrees C. for example) but, as pressurization by the compressor 33 is adiabatic compression, the pressurized air can rather rise in temperature up to a high temperature (100 degrees C. for example). As the high-temperature air cannot be supplied to the pressurized cabin, the airplane 1 is comprised of a ram air channel 13 in order to cool it down to a temperature comfortable to occupants.

The ram air channel 13 is comprised of a ram intake 17 opened at the bottom of the body 3, a heat exchanger 35 in communication therewith, and an exhaust port 19 further in communication therewith and opened at the bottom of the body 3. Ram air Ar flows through the ram intake 17 into the ram air channel 13, cools the pressurized air at the heat exchanger 35, and is exhausted out as exhaust air Ex through the exhaust port 19 to the exterior.

Figure 3:
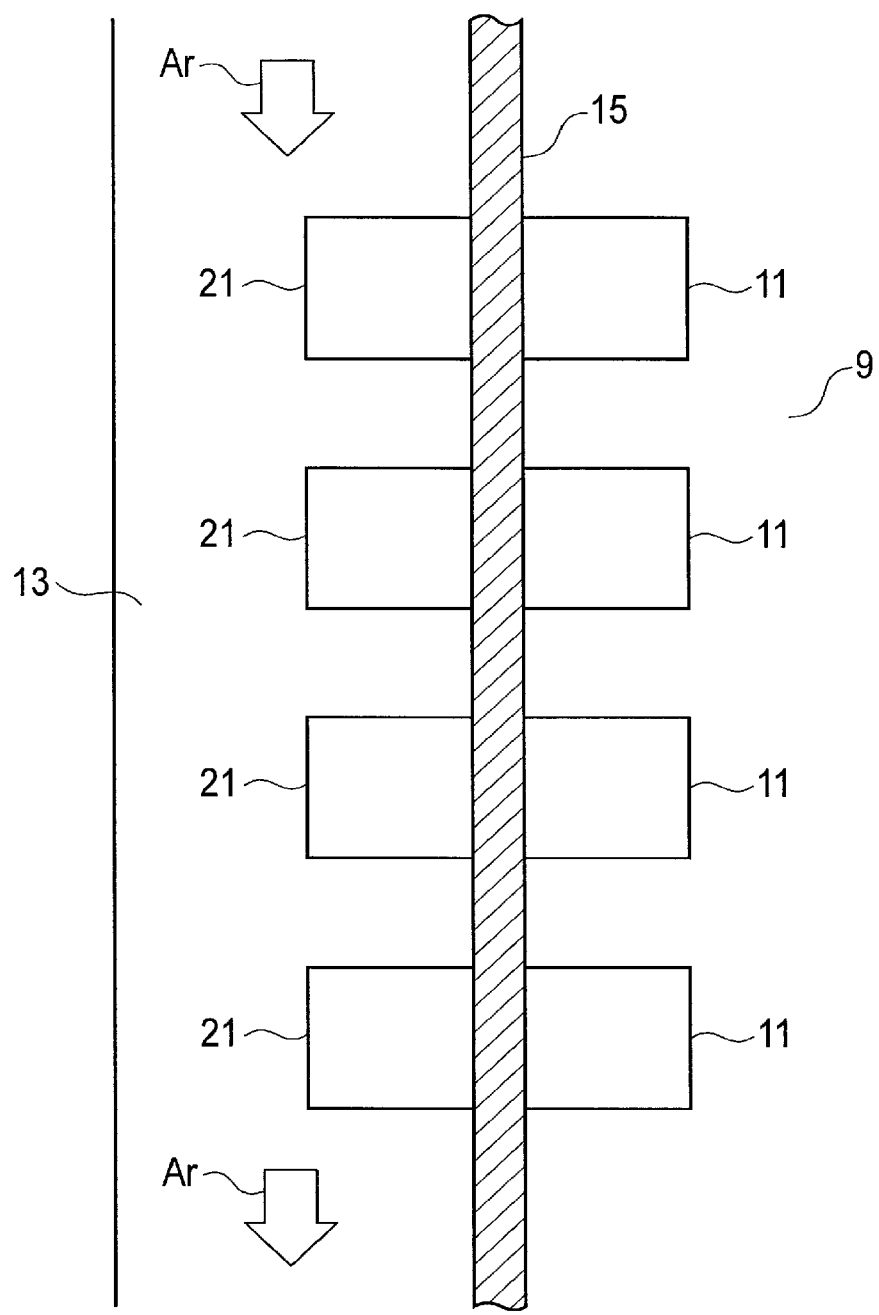
FIG. 3 is a schematic block diagram of the pressurized cabin, the ram air channel and a cooling device.

Referring to FIG. 3 in combination with FIGS. 1 and 2, respective devices or elements 11 in the power supply system are arranged in the pressurized electric chamber 9 and are thermally in contact with thermal conductors 21 for heat extraction. The term "thermally in contact" here means not only to have mere structural contact but also to have contact close enough to reduce thermal resistance. This definition is used throughout the description and the appended claims. As being well known to one skilled in the art, to establish such thermal contact, adhesives such as thermal grease are available.

One or more partition walls 15 air-tightly separate the electric chamber 9 from the ram air channel 13. The thermal conductors 21 extend from the electric chamber 9 over the partition walls 15 to the ram air channel 13 and are thus exposed to the ram air channel 13. Each thermal conductor 21 has a tip with a structure that increases its surface area, such as a plurality of fins, thereby functioning as a heat exchanger. The tips of the thermal conductors 21 are exposed to the flow of the ram air Ar so as to radiate heat by the respective devices or elements 11 to the ram air Ar.

Each thermal conductor 21 may be a unitary body from the interior of the electric chamber 9 to the ram air channel 13 and may air-tightly penetrate the partition walls 15. In this configuration, the partition walls 13 may not be required to contribute to heat exchange. Each thermal conductor 21 may be an aggregation of plural solid bodies but instead may be a single unitary body. Being a single unitary body is advantageous in light of reduction of thermal resistance.

Each thermal conductor 21 may be of any thermally conductive substance such as aluminum, copper, silver or carbon (or graphite) to realize sufficiently low thermal resistance, or may be constituted of a heat-transfer device such as a heat pipe in part or totally.

Further, each thermal conductor 21 may not penetrate the partition walls 15. One body of each thermal conductor 21 may be thermally in contact with the partition walls 15 and another body thereof may be thermally in contact with the partition walls 15 so that they transfers heat via the partition walls 15. In this configuration, the partition walls 15 constitute a part of the heat transfer path from the devices or elements 11 to the ram air channel 13. To reduce thermal resistance, any thermally conductive substance such as aluminum, copper, silver or carbon (or graphite) can be applied to the partition walls 15.

The cooling device as described above radiates heat by the respective devices or elements 11 to the ram air Ar through the heat exchanger constituted of the thermal conductors 21 beyond the partition walls 15 separating the pressurized cabin from the ram air channel 13. While the devices or elements 11 are arranged in the pressurized cabin, heat therefrom is soon radiated from the pressurized cabin to the exterior so that the heat does not cause notable temperature rise in the respective devices or elements and the pressurized cabin, or does not affect thermal balance in the pressurized cabin. Further, as the devices or elements 11 are operated in the pressurized air, electric discharge is unlikely to occur even if they use direct current at relatively high voltage. The power supply system can use direct current at relatively high voltage and thus realize high energy efficiency.

This cooling device uses the ram air channel that an airplane normally has and does not require any other special air introduction systems. It does not limit utilization of internal space in the airplane and does not cause weight increase as well.

Although certain embodiments have been described above, modifications and variations of the embodiments described above will occur to those skilled in the art, in light of the above teachings.

INDUSTRIAL APPLICABILITY

A cooling device that does not require an ambient air introduction system prepared particularly for cooling electronic devices is provided.

What is claimed is:

1. A cooling device applicable to an airplane having a pressurized cabin and a ram air channel for cooling a power electronics device in a power supply system arranged in the pressurized cabin, comprising:
   a partition wall separating the pressurized cabin from the ram air channel; and
   a heat exchanger thermally in contact with the power electronics device and exposed to the ram air channel so as to radiate heat generated by the power electronics device to a ram air.

2. The cooling device of claim 1, wherein the heat exchanger gets thermally in contact with both faces of the partition wall, one of the faces facing to the pressurized cabin and another of the faces facing to the ram air channel, whereby the heat exchanger and the partition wall constitute a heat transfer path for transmitting heat from the power electronics device to the ram air channel.

3. The cooling device of claim 1, wherein the heat exchanger further includes a heat pipe.

4. The cooling device of claim 1, wherein connection between the power electronics device and the heat exchanger does not include circulation of a cooling medium.

5. The cooling device of claim 1, wherein the heat exchanger is directly in contact with the power electronics device.

* * * * *